(12) United States Patent
Mazzochette et al.

(10) Patent No.: US 7,728,341 B2
(45) Date of Patent: Jun. 1, 2010

(54) ILLUMINATION DEVICE FOR PROVIDING DIRECTIONALLY GUIDED LIGHT

(75) Inventors: Joseph Mazzochette, Cherry Hill, NJ (US); Edmar Amaya, King of Prussia, PA (US)

(73) Assignee: Lighting Science Group Corporation, Satellite Beach, FL (US)

( * ) Notice: Subject to any disclaimer, the term of this patent is extended or adjusted under 35 U.S.C. 154(b) by 860 days.

(21) Appl. No.: 11/602,148

(22) Filed: Nov. 20, 2006

(65) Prior Publication Data

US 2007/0064429 A1 Mar. 22, 2007

Related U.S. Application Data

(63) Continuation of application No. 10/822,191, filed on Apr. 9, 2004, now abandoned.

(51) Int. Cl.
 *H01L 29/22* (2006.01)
 *H01L 21/00* (2006.01)

(52) U.S. Cl. .............. 257/98; 257/99; 438/26

(58) Field of Classification Search .............. None
See application file for complete search history.

(56) References Cited

U.S. PATENT DOCUMENTS

| | | |
|---|---|---|
| 3,711,789 A | 1/1973 | Dierschke |
| 4,886,709 A | 12/1989 | Sasame et al. |
| 4,935,655 A | 6/1990 | Ebner |
| 5,117,281 A | 5/1992 | Katsuraoka |
| 5,122,781 A | 6/1992 | Saubolle |
| 5,140,220 A | 8/1992 | Hasegawa |
| 5,482,898 A | 1/1996 | Marrs |
| 5,485,037 A | 1/1996 | Marrs |
| 5,581,876 A | 12/1996 | Prabhu et al. |
| 5,660,461 A | 8/1997 | Ignatius et al. |
| 5,725,808 A | 3/1998 | Tormey et al. |
| 5,745,624 A | 4/1998 | Chan et al. |
| 5,841,244 A | 11/1998 | Hamilton et al. |
| 5,847,935 A | 12/1998 | Thaler et al. |
| 5,857,767 A | 1/1999 | Hochstein |
| 5,953,203 A | 9/1999 | Tormey et al. |
| 5,977,567 A | 11/1999 | Verdiell |
| 6,016,038 A | 1/2000 | Mueller et al. |
| 6,045,240 A | 4/2000 | Hochstein |
| 6,220,722 B1 | 4/2001 | Begemann |
| 6,259,838 B1 | 7/2001 | Singh et al. |
| 6,259,846 B1 | 7/2001 | Roach et al. |
| 6,318,886 B1 | 11/2001 | Stopa et al. |
| 6,325,524 B1 | 12/2001 | Weber et al. |
| 6,376,268 B1 | 4/2002 | Verdiell |

(Continued)

FOREIGN PATENT DOCUMENTS

JP 2000294701 10/2000

*Primary Examiner*—Scott B Geyer
(74) *Attorney, Agent, or Firm*—Cantor Colburn LLP (57) ABSTRACT

In accordance with the invention, an illumination device comprises a highly thermally conductive substrate having a surface, a plurality of light emitting diodes (LEDs) supported by the surface and arranged in an array to provide illumination. At least one reflective barrier at least partially surrounds each LED. The reflective barrier is shaped to reflect away from the LED light emitted by other LEDs in the array. Advantageously the LEDs and reflective barrier are thermally coupled to a heat spreader to dissipate heat generated by the LEDs. The substrate preferably comprises an LTTC-M heat spreader, and the reflective thermal barriers preferably comprise metal ridges or cups.

31 Claims, 7 Drawing Sheets

U.S. PATENT DOCUMENTS

| | | |
|---|---|---|
| 6,428,189 B1 | 8/2002 | Hochstien |
| 6,455,930 B1 | 9/2002 | Palanisamy et al. |
| 6,480,389 B1 | 11/2002 | Shie et al. |
| 6,483,623 B1 | 11/2002 | Maruyama |
| 6,518,502 B2 | 2/2003 | Hammond et al. |
| 6,634,750 B2 | 10/2003 | Neal et al. |
| 6,634,770 B2 | 10/2003 | Cao |
| 6,670,751 B2 | 12/2003 | Song et al. |
| 6,692,252 B2 | 2/2004 | Scott |
| 6,707,069 B2 * | 3/2004 | Song et al. ............... 257/79 |
| 6,793,374 B2 | 9/2004 | Begemann |
| 6,949,771 B2 | 9/2005 | Yoganandan et al. |
| 7,033,060 B2 | 4/2006 | Dubuc |
| 7,038,195 B2 * | 5/2006 | Kida et al. ............... 250/239 |
| 7,166,873 B2 * | 1/2007 | Okazaki ................. 257/98 |
| 7,264,378 B2 * | 9/2007 | Loh ..................... 362/294 |
| 7,282,740 B2 * | 10/2007 | Chikugawa et al. ........ 257/79 |
| 7,439,549 B2 * | 10/2008 | Marchl et al. ............ 257/88 |
| 2001/0032985 A1 | 10/2001 | Bhat et al. |
| 2002/0004251 A1 | 1/2002 | Roberts et al. |
| 2002/0034834 A1 | 3/2002 | Verdiell |
| 2002/0163006 A1 | 11/2002 | Yoganandan et al. |
| 2002/0175621 A1 | 11/2002 | Song et al. |
| 2002/0176250 A1 | 11/2002 | Bohler et al. |
| 2003/0010993 A1 | 1/2003 | Nakamura et al. |
| 2003/0025465 A1 | 2/2003 | Swanson et al. |
| 2003/0057421 A1 | 3/2003 | Chen |
| 2004/0026706 A1 | 2/2004 | Bogner et al. |
| 2004/0150995 A1 | 8/2004 | Coushaine et al. |
| 2004/0222433 A1 | 11/2004 | Mazzochette et al. |
| 2005/0029535 A1 | 2/2005 | Mazzochette et al. |
| 2005/0189557 A1 | 9/2005 | Mazzochette et al. |
| 2005/0225222 A1 | 10/2005 | Mazzochette et al. |

* cited by examiner

FIG. 1

PRIOR ART

FIG. 2

PRIOR ART

FIG. 3

PRIOR ART

PRIOR ART

ILLUMINATION DEVICE FOR PROVIDING DIRECTIONALLY GUIDED LIGHT

CROSS-REFERENCE TO RELATED APPLICATION

This application is a continuation of U.S. patent application Ser. No. 10/822,191 filed on Apr. 9, 2004 ("Light Emitting Diode Arrays With Improved Light Extraction"), now abandoned. U.S. patent application Ser. No. 10/822,191 is hereby incorporated herein by reference in its entirety.

FIELD OF THE INVENTION

This invention relates to light emitting diode (LED) arrays and, in particular, to LED arrays with integral reflective barriers and methods for making same.

BACKGROUND OF THE INVENTION

Light emitting diodes (LEDs) are being used as light sources in an increasing variety of applications extending from communications and instrumentation to household, automotive and other visual displays. LED arrays comprise a plurality of LEDs arranged on a common substrate. One problem with LED arrays is the significant heat generated by dense concentrations of LEDs. Solutions to the thermal problems associated with LED arrays are the subject of a related application entitled, "Light Emitting Diodes Packaged For High Temperature Operation" U.S. patent application Ser. No. 10/638,579, filed Aug. 11, 2003. The Ser. No. 10/630,579 application is incorporated herein by reference.

Figure 1:
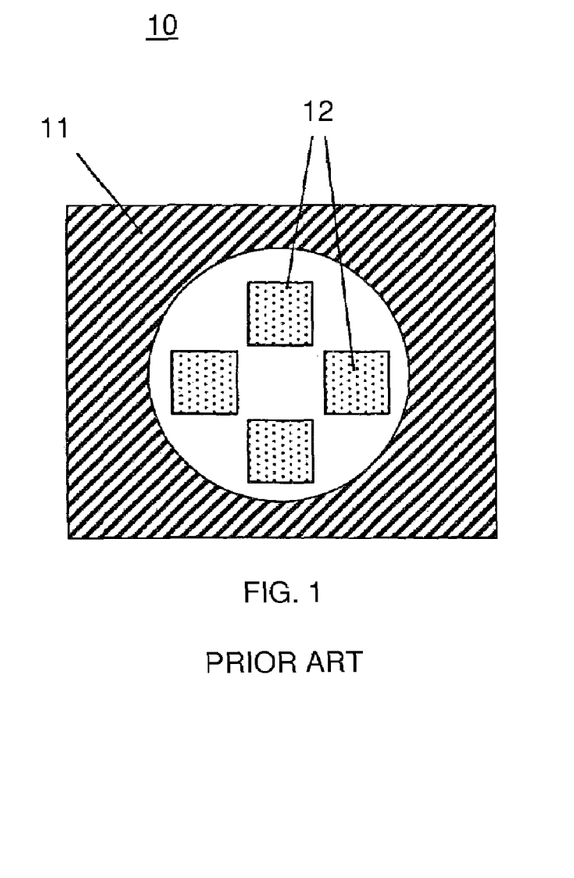
FIG. 1 shows a typical LED array according to the prior art.
Figure 2:
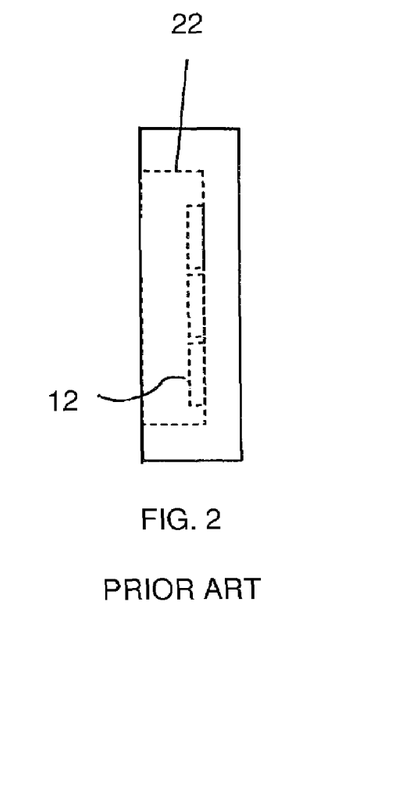
FIG. 2 shows a side view of the LED array of FIG. 1.

Another problem in LED arrays concerns illumination efficiency. Illumination efficiency is a measure of the percentage of generated light that actually leaves an LED package and that can serve as useable light in the intended application. FIGS. 1 and 2 show a typical LED array 10. LED dies (semiconductor chips) 12 generate light. LED dies 12 are typically box-like in structure with 6 sides. Since they are almost always mounted on one of the light surfaces, the other 5 surfaces are capable of emitting light generated by the device. Some of the light is absorbed by nearby walls 22 of array package 11, some is reflected back to the emitting die, and some is absorbed directly by nearby LED die 12 in the array. The remainder of the light exits the package.

There is a relationship between illumination efficiency and the thermal problems of LED arrays. Self-heating by absorption contributes to thermal problems. Thus, there is a need for an LED packaging arrangement that can increase the illumination efficiency of LED array devices and reduce the thermal problems produced by absorption.

SUMMARY OF THE INVENTION

In accordance with the invention, an illumination device comprises a highly thermally conductive substrate having a surface, a plurality of light emitting diodes (LEDs) supported by the surface and arranged in an array to provide illumination. At least one reflective barrier at least partially surrounds each LED. The reflective barrier is shaped to reflect away from the LED light emitted by other LEDs in the array. Advantageously the LEDs and reflective barrier are thermally coupled to a heat spreader to dissipate heat. The substrate preferably comprises an LTTC-M heat spreader, and the reflective thermal barriers preferably comprise metal ridges or cups.

BRIEF DESCRIPTION OF THE DRAWINGS

The advantages, nature and various additional features of the invention will appear more fully upon consideration of the illustrative embodiments now to be described in detail in connection with the accompanying drawings. In the drawings.

It is to be understood that these drawings are for illustrating the concepts of the invention and are not to scale.

DETAILED DESCRIPTION

This description is divided into two parts. Part I describes the structure and features of light emitting diodes (LEDs) packaged in an array for high illumination efficiency in accordance with the invention and illustrate exemplary embodiments. Part II provides further details of the LTCC-M packaging technology as applicable to LED arrays.

I. LEDs PACKAGED FOR HIGH ILLUMINATION EFFICIENCY

Figure 4:
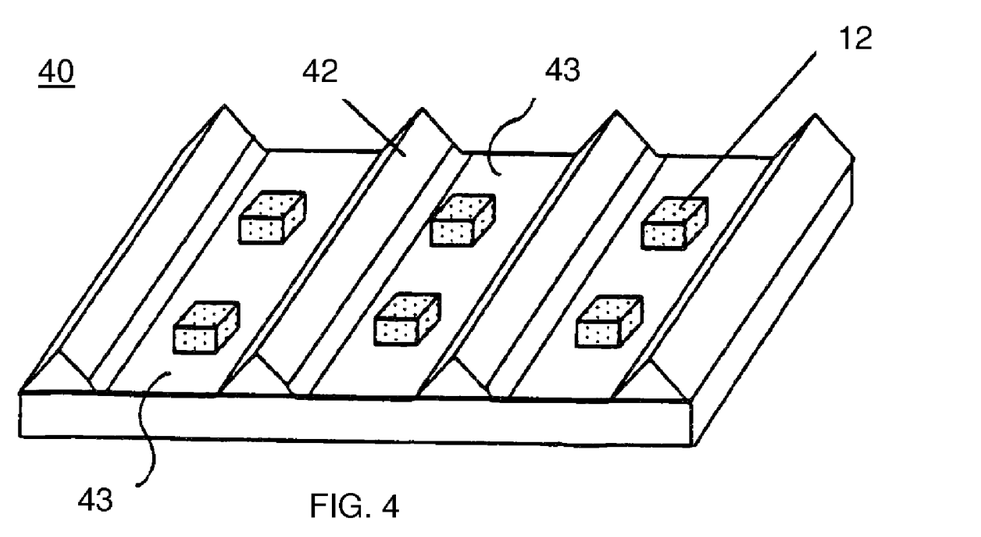
FIG. 4 shows accordion-tapered reflective thermal barriers.

FIG. 4 illustrates, a tapered barrier reflector 40 fabricated as a periodic array of troughs 43 and tapered reflective ridges 42. This accordion-like structure is a particularly cost effective to manufacture. Metal reflective material can be folded in an accordion-like manner to form the tapered reflective barriers 42. LED dies 12 can be affixed in the troughs 43 between reflective barriers 42.

Figure 5:
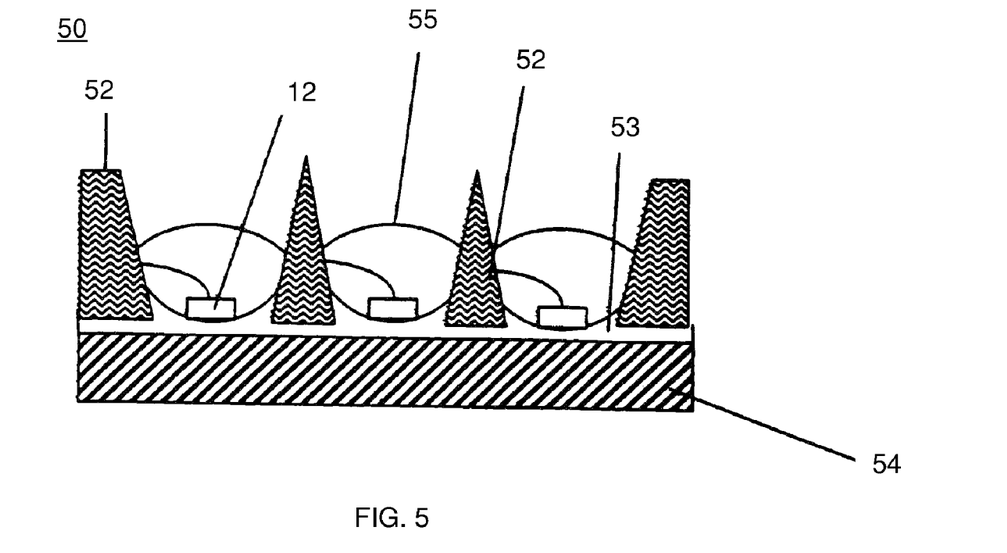
FIG. 5 shows a side view of an LED array with integral tapered thermal barrier reflectors.

The barrier reflector 40 can provide a connection to the anode or cathode of LED dies 12. The barrier 40 also serves a thermal cooling function. Heat from the LED die 12 can be channeled by the barrier reflector 40 to associated thermal spreaders and to a supporting LTCC-M substrate FIG. 5 shows an alternative high efficiency LED array 50 comprising discrete reflective barrier structures 52. The reflective thermal barriers 52 are advantageously shaped as fins causing the heat to move from the bottom of the LED 12 through the thermally conductive material (such as solder or silver epoxy 53) to the top of the fin. The length and angle of the fin can be modified by those skilled in the art. The thermal resistance of a LED array package is inversely proportional to the heat dissipating area. Thus the more and longer reflective thermal barriers 52 are, the larger the area for heat dissipation. The LED devices are subsequently encapsulated as by an optically matched clear epoxy 55 formed in a domed shaped in order to increase light extraction and to minimize total internal reflection (TIR).

LED dies 12 are disposed in an array pattern overlying substrate 54. Tapered discrete reflective barriers 52 cause light that would have been absorbed by other die or walls of the package to reflect out of the array package, thus increasing the illumination efficiency. LED dies 12 can be affixed to substrate 54 by solder or epoxy 53.

Substrate 54 may be non-conducting or conducting. In the case where substrate 54 is conducting, or has overlaying conductive patterns and traces (not shown), an electrical connection can be made on the mounting surface to either the anode or cathode of LED dies 12. In the case of conductive traces, both the anode and cathode connections can be made on the mounting surfaces of dies 12.

Figure 3:
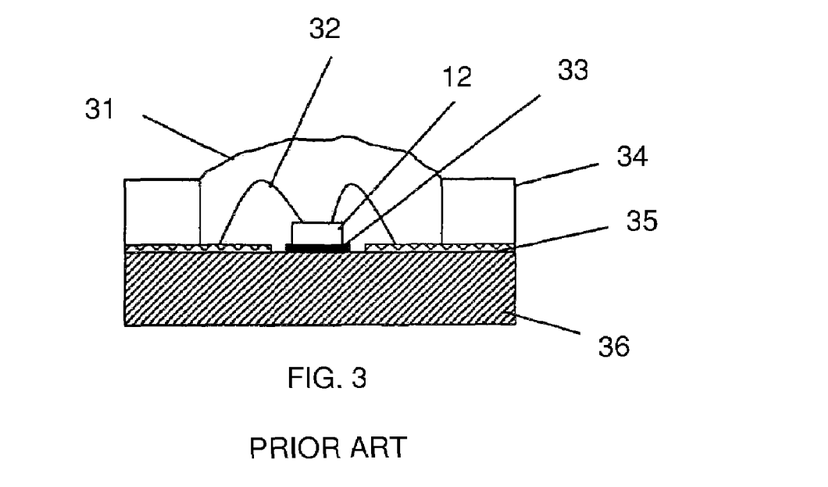
FIG. 3 shows an exemplary LED package of the prior art.

FIG. 3 shows further detail of possible electrical connections to die 12. The electrical connections can be made via wire bonds 32 to the LED anode and cathode. Alternatively either the anode or cathode can make electrical contact with a conductor on an insulating substrate, or a conductive substrate. In this case, the remaining terminal can then be connected to dies 12 by a single wire bond. LED die can be soldered (to a metal substrate 36 or overlying conductor 35) or they can be epoxied 33 to substrate 36. A typically translucent or transparent package wall 34 can support a translucent or transparent LED encapsulate 31.

Figure 6:
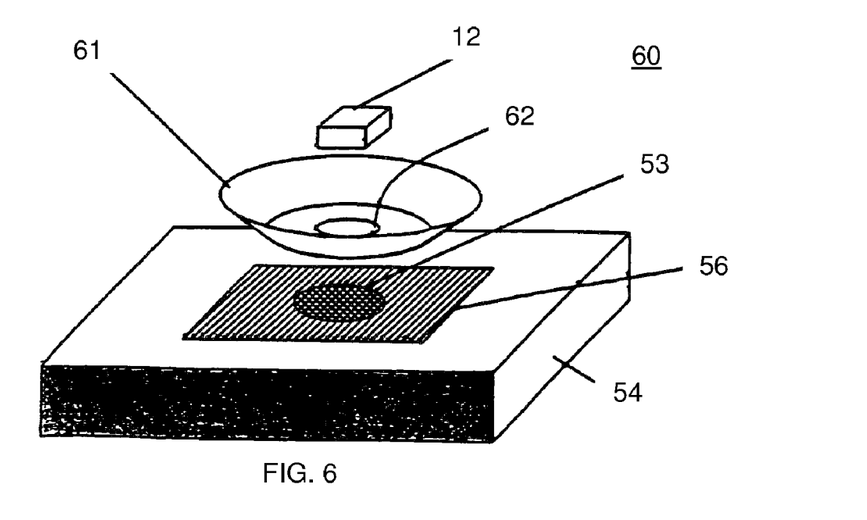
FIG. 6 shows a metal cup tapered reflective barrier.

Turning to FIG. 6, it can be seen that liquid epoxy 53 can be deposited on a metal conductor 56 and conductor 56 can be attached to substrate 54. Conductor 56 can be thick film, thin film, electro-deposited, a metal laminate, or other suitable electrical and thermal conductor. If no electrical contact is required conductor 56 can be omitted; however additional heat spreading from the die can be accomplished if conductor 56 is used. Substrate 54 can be a ceramic, multilayer printed wire board, low temperature cofired ceramic (LTCC), LTCC on metal (LTCC-M), high temperature cofired ceramic (HTCC), or other suitable electrical insulator and thermal conductor. Substrate 54 can be an electrically conducting material if electrical contact to die 12 is desirable, or it can be an electrically insulating layer formed between the substrate and die 12.

FIG. 6 is an exploded view that shows a device 60 where the tapered barrier is a reflective cup 61. LED dies 12 can then be affixed within each cup 61. Each cup 61 is affixed to substrate 54 by solder or epoxy. A small hole 62, with a diameter slightly smaller than the width of the die, can be formed in cup 61. The hole 62 allows some of the liquid epoxy or solder to seep into the cup. Die 12 is then placed into the cup on top of the epoxy or solder. Similarly, LED die 12 can be placed in cup 61 and bonded directly through hole 62 to substrate 54 by epoxy or solder. While hole 62 is not required in assembly 60, the hole facilitates fabrication because the additional step of adding epoxy or solder in the cup for the die can be avoided.

Cup 61 can be fabricated from aluminum, stainless steel, tin, nickel, or other reflective material. The cups can be formed by stamping, etching, coining, machining, or other manufacturing method. Assembly of an array of LED die in reflective cup tapered barriers can be accomplished using inexpensive pick-and-place assembly.

Figure 7:
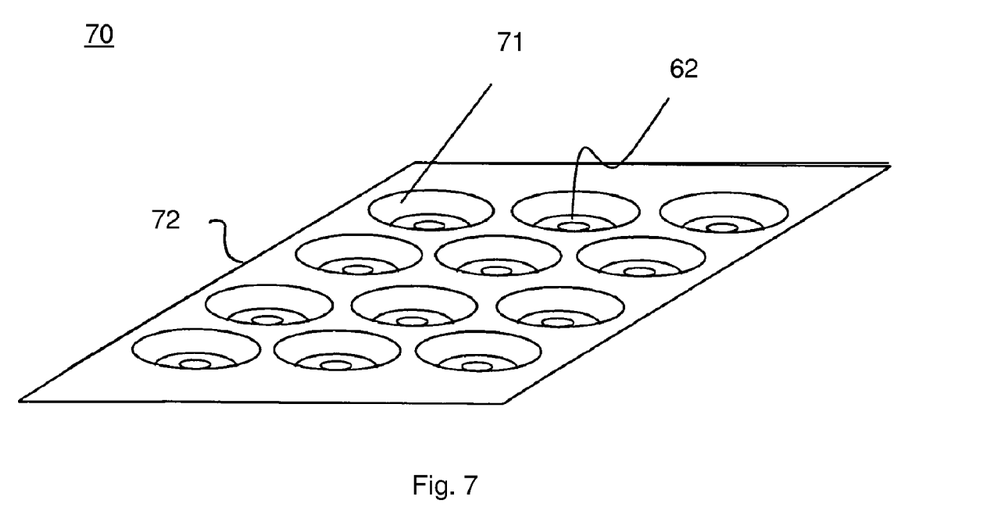
FIG. 7 shows a multi-cup tapered reflective barrier.

FIG. 7 illustrates an advantageous embodiment 70 using an array of cups 71. This multi-cup assembly can be pressed, stamped, or otherwise formed from a sheet of metal 72. Cups 71 need not be round and can be elliptical, square, or rectangular in shape. The metal can gauge from 0.002" to 0.030", and it can comprise brass, copper, phosphorous bronze, beryllium copper, stainless steel, titanium, Inconel, carbon or alloy steel or precious metal.

Figure 8:
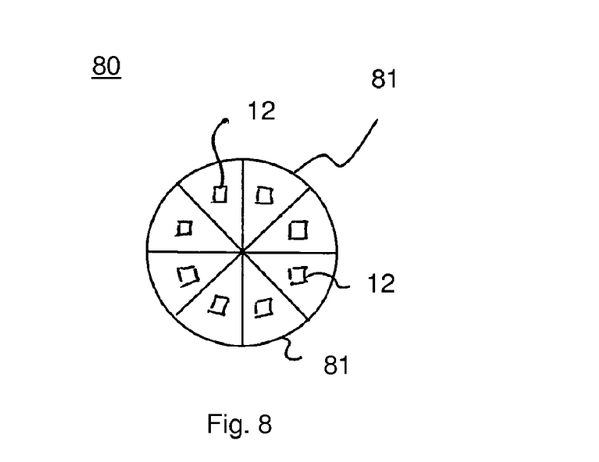
FIG. 8 shows wedge shaped cup tapered barriers arranged to form a circular array.

FIG. 8 shows a circular array 80 created from wedge-shaped sector cups 81. Each wedge 81 can include an LED die 12, and the sector cups can be arranged in the form of a circle.

Figure 9:
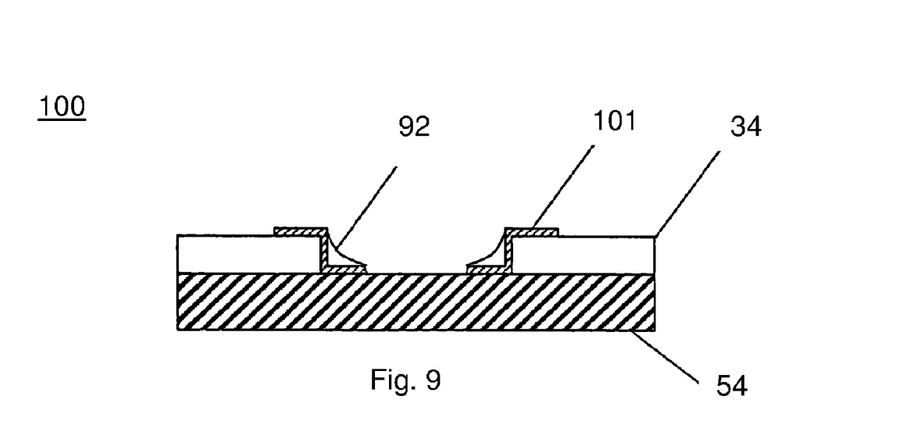
FIGS. 9-11 show exemplary reflecting surfaces on an LED cavity wall, according to embodiments of the present invention.
Figure 10:
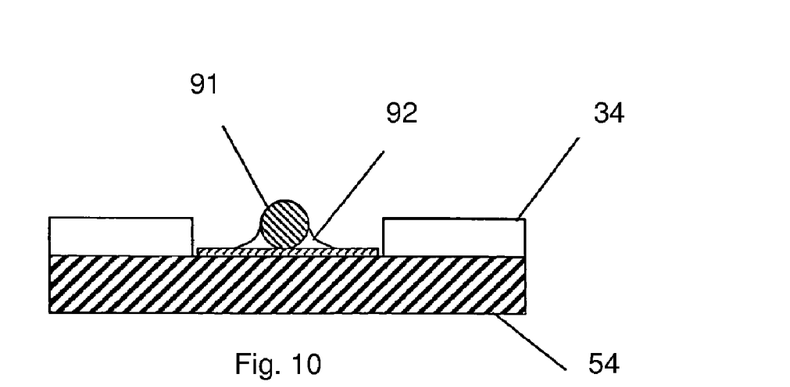
Figure 11:
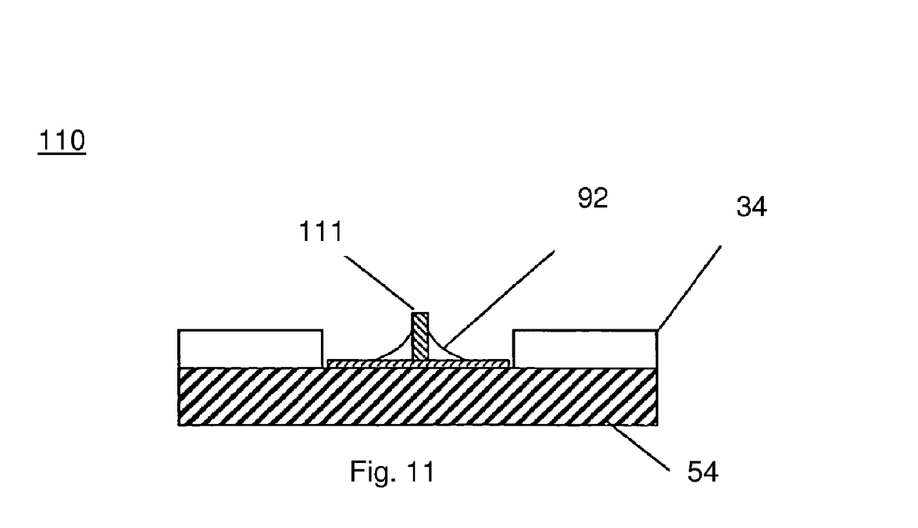

Referring to FIGS. 9, 10 and 11, yet another method to create a reflecting surface on an LED cavity wall is to metallize the wall of the cavity with a thick or thin reflective metal film 101, such as silver. Then a molten reflecting metal 92 such as solder is applied to use the cavity edge as a capillary holder (FIG. 9). The molten metal will conform to the edge capillary and will shape the reflector cup wall into a parabola shape as seen in assemblies 100 and 110. The middle of the cup can have a metal insert such as a high temperature solder ball 91 (FIG. 10) or a metal/solder column 111 (FIG. 11).

In all of the above mentioned embodiments, the materials used to form the reflective barriers should have low absorption characteristics in the 300 to 800 nm wavelength range. The barrier surfaces can be dispersive or non-dispersive depending on the application.

Figure 12:
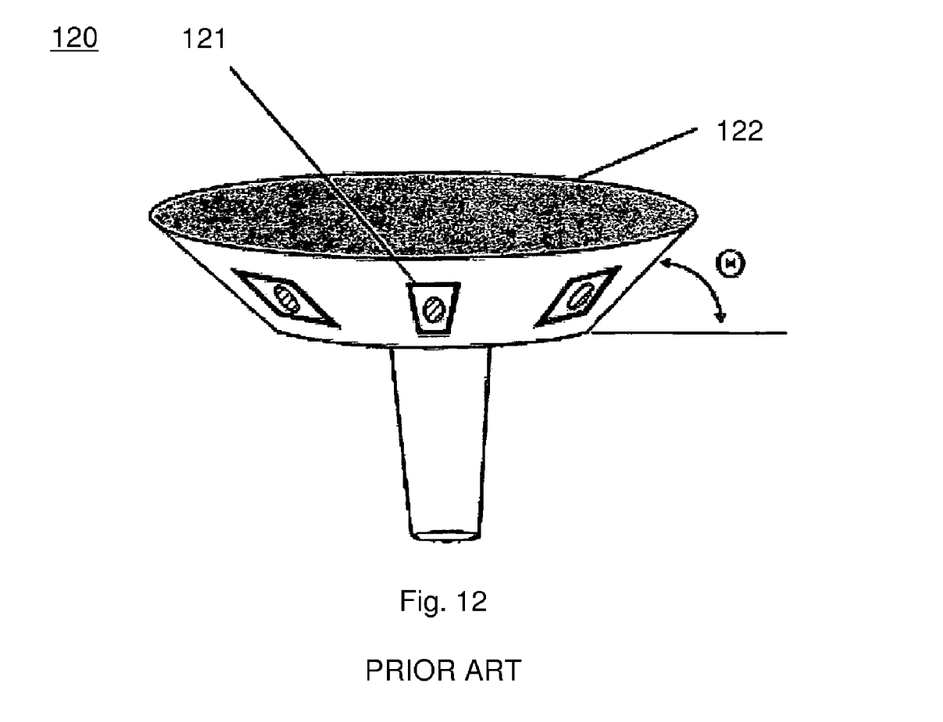
FIG. 12 shows an assembly including a mushroom-like heat sink.

It is sometimes desirable to direct light that comes out of the LED on to a certain target. FIG. 12 shows a conventional assembly 120 composed of multiple subassemblies 121 illuminating from the periphery of a mushroom-like heat sink 122. The target illumination profile of this subassembly is 360 degrees at an inclination angle $\theta$. In order to direct light at this angle, a truncated cone shape heat sink would have to be machined. Placing the subassemblies on the angled surface of the heat sink is difficult. Standard surface mount (SMT) technology can not be used. Thus fabrication becomes a complex, laborious and expensive process.

Figure 13:
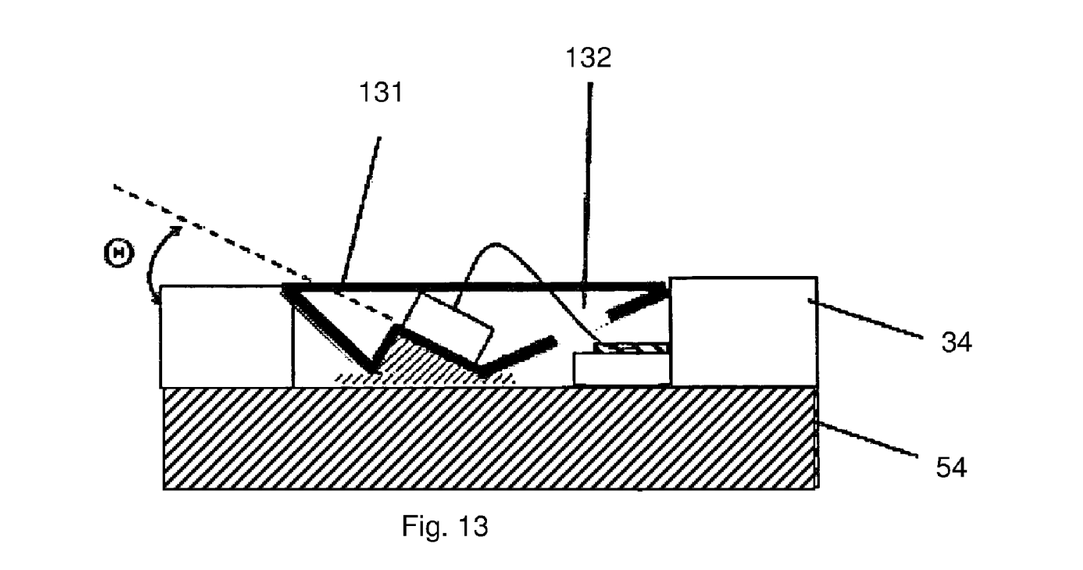
FIG. 13 illustrates an exemplary LED package comprising a stamped reflector adapted for a directional lighting array, according to an embodiment of the present invention.

In accordance with this aspect of the invention, reflector walls are used as guides for reflecting light directionally from an array. The barrier surfaces can be shaped as light guides to reflect the light at a particular target angle. FIG. 13 depicts the outline of a stamped reflector cup 131 adapted for a directional lighting array. Direction at an angle $\theta$ is accomplished by shaping the cup. The die will sit at an angle due to the slope of the cup. The LED die will be connected with the substrate using conductive epoxy and wired using a wirebond though hole 132. The die/cup assemblies can be mounted on a planar substrate by SMT assembly.

Figure 14:
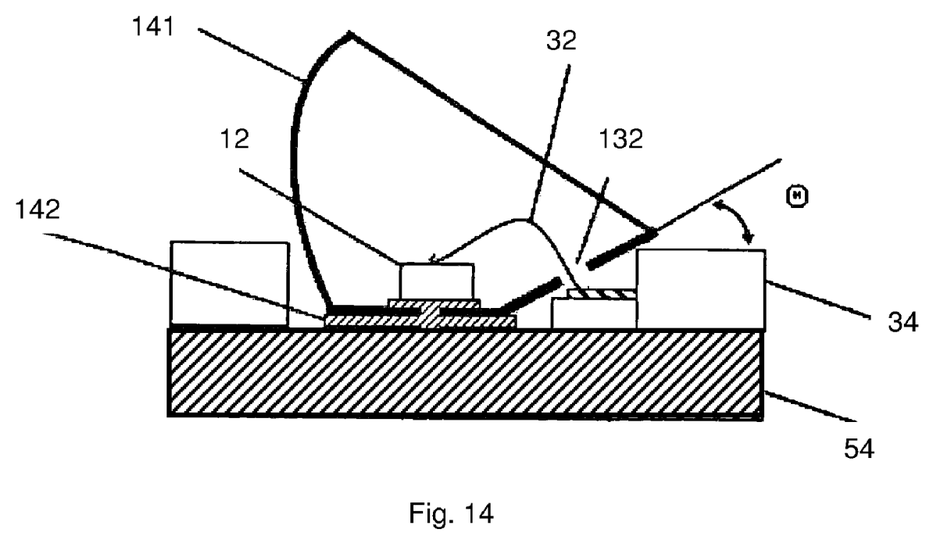
FIG. 14 illustrates an exemplary LED package, according to an embodiment of the present invention.

Another advantageous embodiment is depicted in FIG. 14. The LED 12 can be placed using standard SMT equipment parallel with the thermally conductive substrate. A glob of conductive epoxy 142 is dispensed on the bottom of the cup 141, attaching to the board both the cup and the LED die. The cup 141 is shaped so that the majority of the rays come out at angle $\theta$. The electrical connection can be made with a gold wirebond 32 through a hole 132 in the cup. This embodiment is advantageous due to its simplicity and ease of volume manufacturing. Cup 141 can be fabricated from aluminum, stainless steel, tin, nickel, or other reflective material. It can be formed by stamping, etching, coining, machining, or other manufacturing method.

II. LTCC-M PACKAGING

LTCC-M packaging is particularly suitable for dispensing heat generated by densely packed arrays of LED die. This section highlights some of the important aspects of LTCC-M packaging applicable to fabricating LED arrays with reflective barriers.

Multilayer ceramic circuit boards are made from layers of green ceramic tapes. A green tape is made from particular glass compositions and optional ceramic powders, which are mixed with organic binders and a solvent, cast and cut to form the tape. Wiring patterns can be screen printed onto the tape layers to carry out various functions. Vias are then punched in the tape and are filled with a conductor ink to connect the wiring on one green tape to wiring on another green tape. The tapes are then aligned, laminated, and fired to remove the organic materials, to sinter the metal patterns and to crystallize the glasses. This is generally carried out at temperatures below about 1000° C., and preferably from about 750-950° C. The composition of the glasses determines the coefficient of thermal expansion, the dielectric constant and the compatibility of the multilayer ceramic circuit boards to various electronic components. Exemplary crystallizing glasses with inorganic fillers that sinter in the temperature range 700 to 1000° C. are Magnesium Alumino-Silicate, Calcium Boro-Silicate, Lead Boro-Silicate, and Calcium Alumino-Boricate.

More recently, metal support substrates (metal boards) have been used to support the green tapes. The metal boards lend strength to the glass layers. Moreover since the green tape layers can be mounted on both sides of a metal board and can be adhered to a metal board with suitable bonding glasses, the metal boards permit increased complexity and density of circuits and devices. In addition, passive and active components, such as resistors, inductors, and capacitors can be incorporated into the circuit boards for additional functionality. Where optical components, such as LEDs are installed, the walls of the ceramic layers can be shaped and/or coated to enhance the reflective optical properties of the package, or reflective barriers as described herein in Part I, can be used to further improve both the illumination and thermal efficiency of the LED array package.

This system, known as low temperature cofired ceramic-metal support boards, or LTCC-M, has proven to be a means for high integration of various devices and circuitry in a single package. The system can be tailored to be compatible with devices including silicon-based devices, indium phosphide-based devices and gallium arsenide-based devices, for example, by proper choice of the metal for the support board and of the glasses in the green tapes.

The ceramic layers of the LTCC-M structure must be matched to the thermal coefficient of expansion of the metal support board. Glass ceramic compositions are known that match the thermal expansion properties of various metal or metal matrix composites. The LTCC-M structure and materials are described in U.S. Pat. No. 6,455,930, "Integrated heat sinking packages using low temperature co-fired ceramic metal circuit board technology", issued Sep. 24, 2002 to Ponnuswamy, et al and assigned to Lamina Ceramics. U.S. Pat. No. 6,455,930 is incorporated by reference herein. The LTCC-M structure is further described in U.S. Pat. Nos. 5,581,876, 5,725,808, 5,953,203, and 6,518502, all of which are assigned to Lamina Ceramics and also incorporated by reference herein.

The metal support boards used for LTCC-M technology do have a high thermal conductivity, but some metal boards have a high thermal coefficient of expansion, and thus a bare die cannot always be directly mounted to such metal support boards. However, some metal support boards are known that can be used for such purposes, such as metal composites of copper and molybdenum (including from 10-25% by weight of copper) or copper and tungsten (including 10-25% by weight of copper), made using powder metallurgical techniques. Copper clad Kovar®, a metal alloy of iron, nickel, cobalt and manganese, a trademark of Carpenter Technology, is a very useful support board. AlSiC is another material that can be used for direct attachment, as can aluminum or copper graphite composites.

Another instance wherein good cooling is required is for thermal management of flip chip packaging. Densely packed microcircuitry, and devices such as decoder/drivers, amplifiers, oscillators and the like which generate large amounts of heat, can also use LTCC-M techniques advantageously. Metallization on the top layers of an integrated circuit bring input/output lines to the edge of the chip so as to be able to wire bond to the package or module that contains the chip. Thus the length of the wirebond wire becomes an issue; too long a wire leads to parasitics. The cost of very high integration chips may be determined by the arrangement of the bond pads, rather than by the area of silicon needed to create the circuitry. Flip chip packaging overcomes at least some of these problems by using solder bumps rather than wirebond pads to make connections. These solder bumps are smaller than wire bond pads and, when the chip is turned upside down, or flipped, solder reflow can be used to attach the chip to the package. Since the solder bumps are small, the chip can contain input/output connections within its interior if multilayer packaging is used. Thus the number of die in it, rather than the number and size of bond pads will determine the chip size.

However, increased density and integration of functions on a single chip leads to higher temperatures on the chip, which may prevent full utilization of optimal circuit density. The only heat sinks are the small solder bumps that connect the chip to the package. If this is insufficient, small active or passive heat sinks must be added on top of the flip chip. Such additional heat sinks increase assembly costs, increase the number of parts required, and increase the package costs. Particularly if the heat sinks have a small thermal mass, they have limited effectiveness as well.

In the simplest form of the present invention, LTCC-M technology is used to provide an integrated package for a semiconductor component and accompanying circuitry, wherein the conductive metal support board provides a heat sink for the component. A bare semiconductor die, for example, can be mounted directly onto a metal base of the LTCC-M system having high thermal conductivity to cool the semiconductor component. In such case, the electrical signals to operate the component must be connected to the component from the ceramic.

Indirect attachment to the metal support board can also be used. In this package, all of the required components are thermally coupled to a metal support board, that can also incorporate embedded passive components such as conductors and resistors into the multilayer ceramic portion, to connect the various components, i.e., semiconductor components, circuits, heat sink and the like, in an integrated package. In the case of LED arrays, where electrical circuit considerations would dictate an insulating material be used, thermal conduction can be problematic. Here the inventive reflective barriers further serve as thermal spreading devices to help transfer heat received by conduction and radiation through the insulating layer to the metal base.

For a more complex structure having improved heat sinking, the integrated package of the invention combines a first and a second LTCC-M substrate. The first substrate can have mounted thereon a semiconductor device, and a multilayer ceramic circuit board with embedded circuitry for operating the component; the second substrate has a heat sink or conductive heat spreader mounted thereon. Thermoelectric (TEC) plates (Peltier devices) and temperature control circuitry are mounted between the first and second substrates to provide improved temperature control of semiconductor devices. A hermetic enclosure can be adhered to the metal support board.

The use of LTCC-M technology can also utilize the advantages of flip chip packaging together with integrated heat sinking. The packages of the invention can be made smaller, cheaper and more efficient than existing present-day packaging. The metal substrate serves as a heat spreader or heat sink. The flip chip can be mounted directly on the metal substrate, which is an integral part of the package, eliminating the need for additional heat sinking. A flexible circuit can be mounted over the bumps on the flip chip. The use of multilayer ceramic layers can also accomplish a fan-out and routing of traces to the periphery of the package, further improving heat sinking. High power integrated circuits and devices that have high thermal management needs can be used with this new LTCC-M technology.

It is understood that the above-described embodiments are illustrative of only a few of the many possible specific embodiments, which can represent applications of the invention. Numerous and varied other arrangements can be made by those skilled in the art without departing from the spirit and scope of the invention.

What is claimed:

1. A method for fabricating an illumination device, the method comprising the steps of:
   providing a substrate, an LED die and a reflector, the reflector comprising an aperture disposed therethrough;
   depositing a bonding material on a portion of the substrate;
   placing the reflector onto the bonding material, wherein a portion of the bonding material fills at least a portion of the aperture;
   placing an LED die overlying the aperture and in contact with the bonding material; and
   bonding the reflector and LED die to the substrate with the bonding material.

2. The method of claim 1, wherein the bonding material comprises uncured epoxy and the step of bonding the reflector and LED die to the substrate comprises curing the epoxy.

3. The method of claim 2, wherein the epoxy is electrically conductive.

4. The method of claim 1, wherein the aperture has a width smaller than the width of the LED die.

5. The method of claim 1, wherein the bonding material comprises molten solder and the step of bonding the reflector and LED die to the substrate comprises cooling the solder to a solid state.

6. The method of claim 1, wherein the reflector comprises a reflective cup.

7. The method of claim 1, wherein a portion of the LED die is bonded directly to the substrate through the aperture.

8. The method of claim 1, wherein the reflector comprises a thermally conductive material.

9. The method of claim 1, wherein the substrate comprises a printed wire board (PWB).

10. The method of claim 1, wherein the substrate comprises an electrically-conducting metallic layer.

11. The method of claim 1, wherein the LED die comprises a metal heat-spreading film.

12. The method of claim 1, wherein the reflector comprises a stamped metal sheet.

13. The method of claim 1, wherein the reflector comprises a wedge-shaped sector cup.

14. The method of claim 13, wherein the reflector comprises a side surface shaped to direct light provided by the at least one LED die at an inclination angle.

15. The method of claim 13, wherein the LED die is electrically connected to a conductor by a wire bond passing through an opening in a side surface of the reflector.

16. The method of claim 1, wherein the aperture is disposed through an angled surface of the reflector, and the LED die is placed on the angled surface.

17. A method for fabricating an illumination device, the method comprising the steps of:
   providing a substrate, a plurality of LED die and a stamped metal sheet comprising a plurality of reflectors, wherein each reflector comprises an aperture disposed therethrough;
   depositing a bonding material on a portion of the substrate;
   placing the stamped metal sheet onto the bonding material, wherein a portion of the bonding material fills at least a portion of one or more apertures;
   placing one or more of the plurality of LED die overlying one or more apertures and in contact with the bonding material; and
   bonding the stamped metal sheet and plurality of LED die to the substrate with the bonding material.

18. The method of claim 17, wherein the aperture has a width smaller than the width of the LED die.

19. The method of claim 17, wherein the bonding material comprises uncured epoxy and the step of bonding the reflector and LED die to the substrate comprises curing the epoxy.

20. The method of claim 17, wherein the bonding material comprises molten solder and the step of bonding the reflector and LED die to the substrate comprises cooling the solder to a solid state.

21. An illumination device for providing directionally guided light, the device comprising:
   a substrate comprising a conductive portion;
   a reflective cup bonded to the substrate by an electrically conductive bonding material, wherein the reflective cup comprises a bottom surface including at least one angled portion having a first opening, and a side surface including a second opening; and
   an LED die disposed overlying the first opening of the at least one angled portion and electrically coupled to the substrate by the conductive bonding material, wherein a wire bonded to the LED passes through the second opening.

22. The device of claim 21, wherein the bonding material comprises epoxy.

23. The device of claim 22, wherein the epoxy is electrically conductive.

24. The device of claim 21, wherein the bonding material comprises solder.

25. The device of claim 21, wherein the substrate comprises a thermally conductive material.

26. A method for fabricating an illumination device, the method comprising the steps of:
   providing a substrate having a cavity;
   metallizing at least a portion of the cavity with a reflective material; and
   disposing a molten reflecting metal in the cavity such that the molten reflecting metal forms two or more curved surfaces.

27. The method of claim 26, further comprising the step of disposing a support structure in the cavity to provide support for the two or more curved surfaces.

28. The method of claim 27, wherein the support structure comprises solder.

29. The method of claim 27, wherein the support structure comprise a column.

30. The method of claim 27, wherein the support structure comprises a solder ball.

31. The method of claim 26, wherein the cavity is formed on a surface of the substrate.

* * * * *